(12) United States Patent
Greene et al.

(10) Patent No.: US 7,430,137 B2
(45) Date of Patent: Sep. 30, 2008

(54) NON-VOLATILE MEMORY CELLS IN A FIELD PROGRAMMABLE GATE ARRAY

(75) Inventors: Jonathan W. Greene, Palo Alto, CA (US); Fethi Dhaoui, Patterson, CA (US); Robert M. Salter, III, Saratoga, CA (US); John McCollum, Saratoga, CA (US)

(73) Assignee: Actel Corporation, Mountain View, CA (US)

( * ) Notice: Subject to any disclaimer, the term of this patent is extended or adjusted under 35 U.S.C. 154(b) by 0 days.

(21) Appl. No.: 11/868,694

(22) Filed: Oct. 8, 2007

(65) Prior Publication Data

US 2008/0025091 A1    Jan. 31, 2008

Related U.S. Application Data

(60) Division of application No. 11/274,930, filed on Nov. 14, 2005, now abandoned, which is a continuation-in-part of application No. 10/939,117, filed on Sep. 9, 2004, now abandoned.

(51) Int. Cl.
| | |
|---|---|
| G11C 16/02 | (2006.01) |
| G11C 5/02 | (2006.01) |
| G11C 5/06 | (2006.01) |
| G06F 7/38 | (2006.01) |
| H03K 19/173 | (2006.01) |
| H03K 19/177 | (2006.01) |
| H03K 19/94 | (2006.01) |

(52) U.S. Cl. ............. 365/185.05; 365/188; 365/189.02; 365/230.02; 326/38; 326/39; 326/44; 326/49

(58) Field of Classification Search ............ 365/185.05, 365/185.06, 185.08, 188, 189.02, 230.02; 326/38, 39, 40, 44, 45, 46, 49, 50
See application file for complete search history.

(56) References Cited

U.S. PATENT DOCUMENTS 4,128,773 A    12/1978    Troutman et al.

(Continued)

OTHER PUBLICATIONS

"Shadow RAM Cell and Shadow RAM", IBM Technical Disclosure Bulletin, Aug. 1, 1990, vol. 33, No. 3B, pp. 439-440, IBM, Armonk, N.Y., USA.

(Continued)

*Primary Examiner*—J. H. Hur
(74) *Attorney, Agent, or Firm*—Lewis and Roca LLP

(57) ABSTRACT

A non-volatile memory cell comprises a first floating gate transistor having a source, a drain, and a gate electrically coupled to a row line. A second floating gate transistor has a source, a drain, and a gate electrically coupled to the row line. A first p-channel MOS transistor has a source, a drain, and a gate, the drain of the first p-channel MOS transistor electrically coupled to the drain of the first floating gate transistor forming a first common node. A second p-channel MOS transistor has a source, a drain, and a gate, the first drain of the second p-channel MOS transistor electrically coupled to the drain of the second floating gate transistor forming a second common node, the gate of the second p-channel MOS transistor electrically coupled to the first common node, and the second common node electrically coupled to the gate of the first p-channel MOS transistor.

7 Claims, 13 Drawing Sheets

U.S. PATENT DOCUMENTS

| | | | |
|---|---|---|---|
| 4,805,148 A | 2/1989 | Diehl-Nagle et al. | |
| 5,014,226 A | 5/1991 | Horstmann et al. | |
| 5,126,279 A | 6/1992 | Roberts | |
| 5,170,373 A * | 12/1992 | Doyle et al. | 365/185.17 |
| 5,440,508 A | 8/1995 | Pathak et al. | |
| 5,523,971 A | 6/1996 | Rao | |
| 5,572,461 A | 11/1996 | Gonzalez | |
| 5,581,501 A * | 12/1996 | Sansbury et al. | 365/185.01 |
| 5,592,417 A | 1/1997 | Mirabel | |
| 5,594,363 A | 1/1997 | Freeman et al. | |
| 5,627,784 A | 5/1997 | Roohparvar | |
| 5,633,518 A | 5/1997 | Broze | |
| 5,640,344 A | 6/1997 | Pani et al. | |
| 5,740,106 A | 4/1998 | Nazarian | |
| 5,761,120 A | 6/1998 | Peng et al. | |
| 5,764,096 A | 6/1998 | Lipp et al. | |
| 5,773,862 A | 6/1998 | Peng et al. | |
| 5,812,450 A | 9/1998 | Sansbury et al. | |
| 5,838,040 A | 11/1998 | Salter, III et al. | |
| 5,841,694 A | 11/1998 | Wong | |
| 5,847,993 A | 12/1998 | Dejenfelt | |
| 5,894,148 A | 4/1999 | Peng et al. | |
| 6,072,720 A | 6/2000 | Peng et al. | |
| 6,128,243 A | 10/2000 | Chan et al. | |
| 6,137,728 A | 10/2000 | Peng et al. | |
| 6,144,580 A | 11/2000 | Murray | |
| 6,252,273 B1 | 6/2001 | Salter, III et al. | |
| 6,320,784 B1 | 11/2001 | Muralidhar et al. | |
| 6,356,478 B1 | 3/2002 | McCollum | |
| 6,363,011 B1 | 3/2002 | Hirose et al. | |
| 6,954,376 B2 * | 10/2005 | Liou | 365/185.05 |

OTHER PUBLICATIONS

Wang, J. J. et al., "SRAM Based Re-programmable FPGA for Space Applications", IEEE Transactions on Nuclear Science, Dec. 1999, vol. 46, No. 6, pp. 1728-1735, IEEE, N.Y, N.Y, USA.

* cited by examiner

| Mode | CH (V) | CL (V) | R (V) | PWELL (V) | NWELL (V) |
|---|---|---|---|---|---|
| Operate | 0 | 0 | 0.8 | 0 | 0 |
| Erase | 3 | 3 | -15 | 3 | 3 |
| Write (84) | -3 | 3 | 12 | -3 | 3 |
| Write (82) | 3 | -3 | 12 | -3 | 3 |
| Read Vt (82) | 0 | Drive positive & check for sufficient current | VMAR <0.8 | 0 | 0 |
| Read Vt (84) | Drive positive & check for sufficient current | 0 | VMAR <0.8 | 0 | 0 |
| Read Leakage (84) | Drive positive & check for leakage current | 0 | VMAR >0.8 | 0 | 0 |
| Read Leakage (82) | 0 | Drive positive & check for leakage current | VMAR >0.8 | 0 | 0 |

FIG. 2C

| Mode | CH (V) | CL (V) | RH (V) | RL (V) | PWELL (V) | NWELL (V) | ISO (V) |
|---|---|---|---|---|---|---|---|
| Operate | 2.5, (1.5) | 0 | 1.5 | 0 | 0 | 0 | 1.5 |
| ISO Write | 0 | 0 | 0 | 0 | 0 | 0 | 15 |
| Erase | 3 | 3 | -1.5 | -15 | 3 | 3 | 0 |
| Write (114) | -3 | -3 | 0 | 12 | -3 | 3 | 0 |
| Write (112) | -3 | -3 | 12 | 0 | -3 | 3 | 0 |
| Read Vt (112) | lightly loaded to GND; test Vtrip~2.5V, (1.5V) | 3, (2) | <1.5 | 6 | 0 | 0 | 6 |
| Read Vt (114) | lightly loaded to +V~1V; test Vtrip~0V | 0 | 6 | <0 | 0 | 0 | 6 |
| Read Leakage (114) | Force Imax_leak; Vtrip~2.5V, (1.5V) | 0 | 1.5 | >0 | 0 | 0 | 6 |
| Read Leakage (112) | Force Imax_leak; Vtrip~2.5V, (1.5V) | 0 | >1.5 | 0 | 0 | 0 | 6 |

FIG. 3C

| Mode | CH (V) | CL (V) | CH (V) | RL (V) | PWELL (V) | NWELL (V) | ISO (V) |
|---|---|---|---|---|---|---|---|
| Operate | 2.5, (1.5) | 0 | 1.5 | 0 | 0 | 0 | 1.5 |
| ISO Write | 0 | 0 | 0 | 0 | 0 | 0 | 15 |
| Erase | 3 | 3 | -1.5 | -15 | 3 | 3 | 0 |
| Write (154) | -3 | -3 | 0 | 12 | -3 | 3 | 0 |
| Write (152) | -3 | -3 | 12 | 0 | -3 | 3 | 0 |
| Read Vt (152) | lightly loaded to GND; test Vtrip~2.5V, (1.5V) | 3, (2) | <1.5 | 6 | 0 | 0 | 6 |
| Read Vt (154) | lightly loaded to +V~1V; test Vtrip~0V | 0 | 6 | <0 | 0 | 0 | 6 |
| Read Leakage (154) | Force Imax_leak; Vtrip~2.5V, (1.5V) | 0 | 1.5 | >0 | 0 | 0 | 6 |
| Read Leakage (152) | Force Imax_leak; Vtrip~2.5V, (1.5V) | 0 | >1.5 | 0 | 0 | 0 | 6 |

FIG. 4C

| Mode | VSP (V) | CL (V) | RH (V) | RL (V) | PWELL (V) | NWELL (V) | ISO (V) |
|---|---|---|---|---|---|---|---|
| Operate | 2.5, (1.5) | 0 | ~2.2 | 0.8 | 0 | 2.5 | 1.5 |
| ISO Write | 0 | 0 | 0 | 0 | 0 | 0 | 15 |
| Erase | 3 | 3 | 0 | -15 | 3 | 3 | 0 |
| Write (184) | 3 | -3 | 0 | 12 | -3 | 3 | -3 |
| Read Vt (184) | 2.5 | lightly loaded to -V~-1V; test Vtrip=0V | 1.5 | <0 | -1 | 2.5 | 6 |
| Read Leakage (184) | Force Imax_leak; Vtrip~2.5V, (1.5V) | 0 | 1.5 | >0 | 0 | 0 | 6 |

FIG. 5C

NON-VOLATILE MEMORY CELLS IN A FIELD PROGRAMMABLE GATE ARRAY

RELATED APPLICATIONS

This application is a divisional of co-pending U.S. patent application Ser. No. 11/274,930, filed Nov. 14, 2005, which is a continuation-in-part of U.S. patent application Ser. No. 10/939,117, filed on Sep. 9, 2004, both of which are incorporated by reference herein in their entirety.

BACKGROUND OF THE INVENTION

1. Field of the Invention

The present invention relates to a floating gate based field programmable gate array (FPGA). More particularly, the present invention relates to floating gate based memory cells in an FPGA.

2. The Background Art

Programmable logic devices (PLDs) are integrated circuit devices which contain gates or other general-purpose cells whose interconnections can be configured by programming to implement nearly any desired combinatorial or sequential function. Field programmable gate arrays (FPGAs) are well known in the PLD art. FPGAs generally include an array of general-purpose logic circuits, typically referred to as logic blocks, which can be programmed by programmable elements to implement virtually any logic function. The programmed logic elements in the gate array are connected together by routing resources to form a desired integrated circuit. The routing resources are connected to each other and to the logic elements in the gate array by programmable elements.

It is well known in the art that both volatile and non-volatile programmable elements have been used to provide interconnection in FPGA devices. Volatile programmable elements are often a pass transistor controlled by a static random access memory (SRAM) cell. Nonvolatile programmable elements include antifuses and floating gate transistors. Programmable antifuse based architectures and reprogrammable SRAM and floating gate memory cell based architectures are well known in the FPGA art. In an SRAM based reprogrammable FPGA, the programmable elements are typically passgates controlled by information stored in an SRAM configuration memory. In an antifuse based FPGA, the antifuses are programmable elements that are formed by two conductors with a dielectric material sandwiched in between which represent an open state until programmed. The antifuses are disposed to provide the interconnections among the routing resources and to program the programmable logic elements.

In a floating gate transistor based FPGA, the floating gates are typically similar to those used in flash memories the operation of which is well known to those of ordinary skill in the art, but adapted for use in programmable arrays. Generally, in a floating gate transistor, an MOS based transistor has an additional unconnected or floating polysilicon layer disposed in a dielectric between a semiconductor surface and the gate of the MOS transistor. To program the floating gate transistor, electrons are placed on the floating polysilicon layer, and to erase the floating gate transistor, electrons are removed from the floating polysilicon layer. As is well known in the art, a floating gate transistor is programmed when sufficient electrons are placed on the floating polysilicon layer to provide a charge which prevents the floating gate transistor from being turned on by opposing the voltage applied to the gate of the floating gate transistor during normal operation that would typically turn on the floating gate transistor. When these electrons are removed, a normal operating voltage applied to the gate of floating gate transistor will result in current flowing through the floating gate transistor. During a read operation, this current may then be sensed to determine whether a particular floating gate memory cell has been programmed.

Proposed floating gate transistor memory elements employed in programmable logic devices include electrically programmable read only memory (EPROM), electrically erasable and programmable read only memory (EEPROM), flash EEPROM. Ideally, a memory device optimizes density, preserves critical memory in a non-volatile condition, is easy to reprogram, and is read quickly. Flash memory is low-cost, high density, low power, and high reliability devices resulting in a high speed architecture.

FPGA architectures which employ floating gate devices as the storage elements in the memory cells have been proposed. In U.S. Pat. No. 5,812,450 to Sansbury et al., the floating gate based memory cells depicted in FIGS. 1A and 1B are proposed. A seen in FIGS. 1A and 1B, a pair of floating gate devices 10 and 20 are disposed in series between voltage sources 30 and 40. A common connection, described as a sensing node 50 may be employed to either drive a logic input or a switch somewhere on the device. FIG. 1B differs from FIG. 1A in that it includes a select transistor 60 that is disposed between the sensing node 50 and an erase node 70, and is used during the programming and erasure of floating gate devices 50 and 60.

In another known floating gate transistor based FPGA, the memory element of the memory cell employed to provide the interconnections among the routing resources and the programmable logic elements is also the switching element. Although there are some advantages associated with this approach there are also some drawbacks. Typically, as the size of the transistors in the logic change, the floating gate switch transistor does not scale that well with the change in the size of the logic devices. Further, employing a flash device as the switch often requires the switch to be larger in size than a typical flash memory element. As a result, a non-standard process for the larger than typical flash window is often used, and the resulting larger window may create reliability problems of charge retention and disturb of the stored charge during operation. It will be appreciated that weak storage elements are detrimental to the yield of good devices. Additionally, the switch properties are linked to the properties of the flash element. In a flash device, this creates a switch with high impedance, and also a switch that is sensitive to disturb.

There is therefore a need in the art to provide a floating gate based memory cell for a programmable logic device that includes a switch that scales with the logic devices in the programmable logic device, avoids the reliability problems of known floating gate memory switch cells, and does not link the switch in cell to the floating gate properties of the memory cell.

BRIEF DESCRIPTION OF THE INVENTION

In one embodiment of the invention, a non-volatile memory cell includes NMOS flash EEPROM transistors coupled to a column line, row lines, and a common node. A switch is electrically coupled to the common node. In some embodiments, an isolation transistor in the cell is electrically coupled to an isolation line.

BRIEF DESCRIPTION OF THE DRAWINGS

FIG. 2C is a table setting forth the operating voltages applied to the first embodiment of non-volatile memory cell as depicted in FIG. 2A according to the present invention.

FIG. 3C is a table setting forth the operating voltages applied to the second embodiment of non-volatile memory cell as depicted in FIGS. 3A and 3B according to the present invention.

FIG. 4C is a table setting forth the operating voltages applied to the third embodiment of non-volatile memory cell as depicted in FIGS. 4A and 4B according to the present invention.

FIG. 5C is a table setting forth the operating voltages applied to the fourth embodiment of non-volatile memory cell as depicted in FIGS. 5A and 5B according to the present invention.

DETAILED DESCRIPTION

Those of ordinary skill in the art will realize that the following description of the present invention is illustrative only and not in any way limiting. Other embodiments of the invention will readily suggest themselves to such skilled persons.

Generally, in a reprogrammable FPGA architecture according to the present invention, there is included an array of programmable logic block, routing resources for connecting the programmable logic blocks together, an array of routing switch memory cells whose contents are employed to connect the routing resources together, and static configuration memory cells for programming the logic devices.

For the embodiments of the non-volatile memory cells described below according to the present invention, circuits for applying appropriate erase, programming and operating potentials to the floating gate devices and MOS transistors are well known to those of ordinary skill in the art and are therefore not described herein to avoid overcomplicating the disclosure and thereby obscuring the present invention.

Those of ordinary skill in the art will also appreciate that the voltages set forth in the tables below for the operating, erase, write and read modes of the non-volatile memory cell embodiments described below are merely illustrative examples for channel lengths of the flash EEPROM devices on the order of 0.16 microns and for tunnel oxide thicknesses on the order of about 80 to about 100 angstroms. Such skilled persons will readily recognize that the actual voltages to be applied to perform these functions will depend upon the geometry and scaling, as well as the fabrication process employed to form the flash EEPROM transistors utilized in any actual design.

Further, it should be appreciated that a variety of non-volatile memory devices well known to those of ordinary skill in the art may be employed according to the present invention including floating gate devices such as EEPROM, flash EEPROM, silicon nanocrystal MOS transistors, and floating trap devices such as SONOS and MONOS.

Figure 1A:
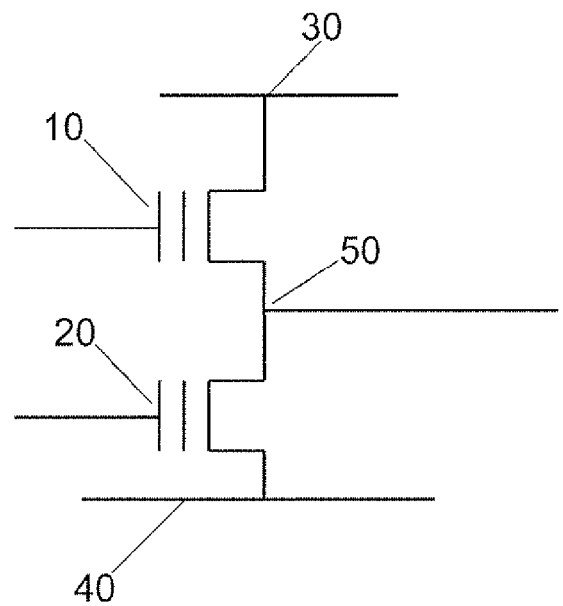
FIGS. 1A and 1B illustrate floating gate memory cells according to the prior art.
Figure 1B:
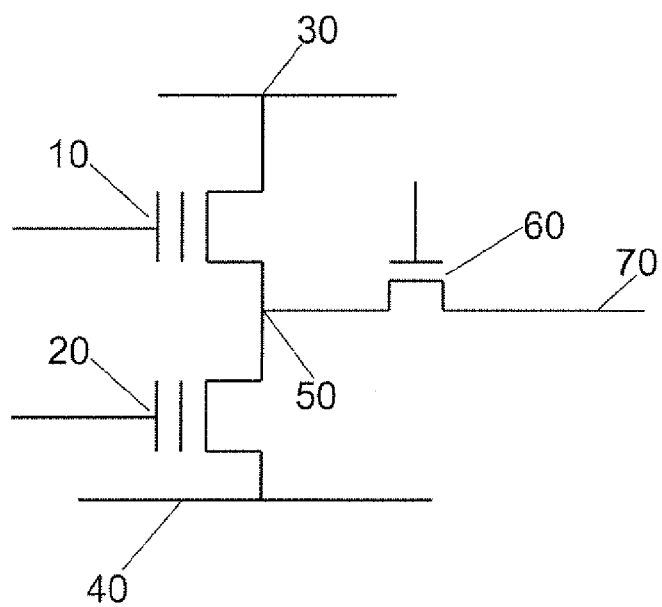
Figure 2A:
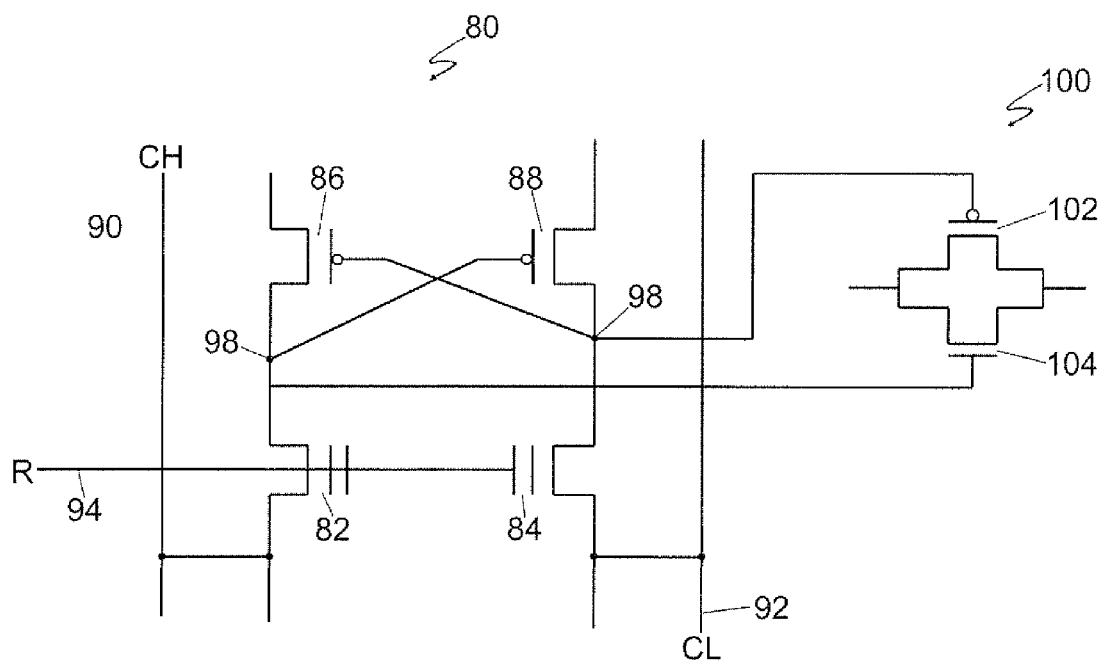
FIG. 2A is a schematic drawing illustrating a first embodiment of a non-volatile memory cell according to the present invention.

FIG. 2A illustrates schematically a first embodiment of a non-volatile memory cell 80 according to the present invention. In non-volatile memory cell 80, first and second NMOS flash EEPROM transistors 82 and 84 are connected as pull-downs to drive cross coupled p-channel MOS transistors 86 and 88. The sources of first and second NMOS flash EEPROM transistors 82 and 84 are electrically coupled to first and second column lines (CH and CL) 90 and 92, respectively, and the drains of NMOS flash EEPROM transistors 82 and 84 are electrically coupled to the gates of p-channel MOS transistors 88 and 86, respectively. The gates of first and second NMOS flash EEPROM transistors 82 and 84 are electrically coupled to a row line (R) 94.

The drains of NMOS flash EEPROM transistors 82 and 84 also form an output node 98 that is coupled to the gates of a CMOS logic switch 100. The CMOS logic transistor switch 100 includes an n-channel MOS transistor 102 and a p-channel MOS transistor 104 whose sources and drains are electrically coupled, respectively. The drain of NMOS flash EEPROM transistor 82 at the output node 98 is electrically coupled to the gate of n-channel MOS transistor 102, and the drain of NMOS flash EEPROM transistor 84 at the output node 98 is coupled to the gate of p-channel MOS transistor 104. The output at output node 98 may otherwise be employed to drive a static device that programs the logic in the FPGA.

Figure 2B:
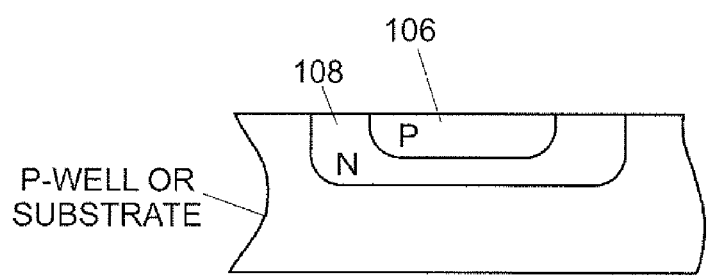
FIG. 2B illustrates in cross section a triple well process suitable for disposing floating gate devices according to the present invention.

FIG. 2B illustrates in cross section a triple well process suitable for disposing the floating gate devices according to the present invention. The triple well process includes a p-type well 106 formed in an n-type well 108 formed in a p-type substrate or well.

FIG. 2C illustrates a table which sets forth the voltages applied to the non-volatile memory cell 80 for the normal operation, erase, write, read and leakage read of the non-volatile memory cell 80. In each of these modes the p-type substrate or well depicted in FIG. 2B is at 0 volts.

In the operating mode, first column line CH is at 0 volts, second column line CL is at 0 volts, row line R is at 0.8 volts and the P-well 106 and the N-well 108 of the triple well process described with respect to FIG. 2B are at 0 volts and 0 volts, respectively.

In the erase mode, first column line CH is at 3 volts, second column line CL is at 3 volts, row line R is at −15 volts and the P-well 106 and the N-well 108 of the triple well process described with respect to FIG. 2B are at 3 volts and 3 volts, respectively.

In the write of second NMOS flash EEPROM transistor 84, first column line CH is at −3 volts, second column line CL is at 3 volts, row line R is at 12 volts and the P-well 106 and the N-well 108 of the triple well process described with respect to FIG. 2B are at −3 volts and 3 volts, respectively.

In the write of first NMOS flash EEPROM transistor 82, first column line CH is at 3 volts, second column line CL is at −3 volts, row line R is at 12 volts and the P-well 106 and the N-well 108 of the triple well process described with respect to FIG. 2B are at −3 volts and 3 volts, respectively.

In the read mode when first NMOS flash EEPROM transistor 82 is erased and second NMOS flash EEPROM transistor 84 is written, a read of the value at first NMOS flash EEPROM transistor 82 is performed when the second column line CL is driven to a positive voltage and then sensed for sufficient current when the row line R is ramped up to less than 0.8 volts. For this condition, the first column line CH is at 0 volts, and the P-well 106 and the N-well 108 of the triple well process described with respect to FIG. 2B are at 0 volts and 0 volts, respectively.

In the read mode when first NMOS flash EEPROM transistor 82 is written and second NMOS flash EEPROM transistor 84 is erased, a read of the value at second NMOS flash EEPROM transistor 84 is performed when the first column line CH is driven to a positive voltage and then sensed for sufficient current when the row line R is ramped up to less than 0.8 volts. For this condition, the second column line CL is at 0 volts, and the P-well 106 and the N-well 108 of the triple well process described with respect to FIG. 2B are at 0 volts and 0 volts, respectively.

In the read mode when first NMOS flash EEPROM transistor 82 is erased and second NMOS flash EEPROM transistor 84 is written, a read of the leakage at second NMOS flash EEPROM transistor 84 is performed when the first column line CH is driven to a positive voltage and then sensed for a leakage current when the row line R is ramped up to greater than 0.8 volts. For this condition, the second column line CL is at 0 volts, and the P-well 106 and the N-well 108 of the triple well process described with respect to FIG. 2B are at 0 volts and 0 volts, respectively.

In the read mode when first NMOS flash EEPROM transistor 82 is written and second NMOS flash EEPROM transistor 84 is erased, a read of the leakage at first NMOS flash EEPROM transistor 82 is performed when the second column line CL is driven to a positive voltage and then sensed for a leakage current when the row line R is ramped up to greater than 0.8 volts. For this condition, the first column line CH is at 0 volts, and the P-well 106 and the N-well 108 of the triple well process described with respect to FIG. 2B are at 0 volts and 0 volts, respectively.

It will be appreciated by those of ordinary skill in the art that during write and read operations unselected rows and columns will be inhibited to prevent write and read disturb of the values in the memory cells in the unselected rows and columns.

Figure 3A:
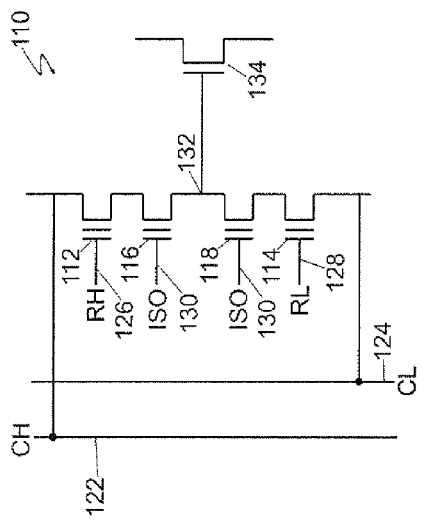
FIGS. 3A and 3B is a schematic drawing illustrating a second embodiment of a non-volatile memory cell according to the present invention.
Figure 3B:
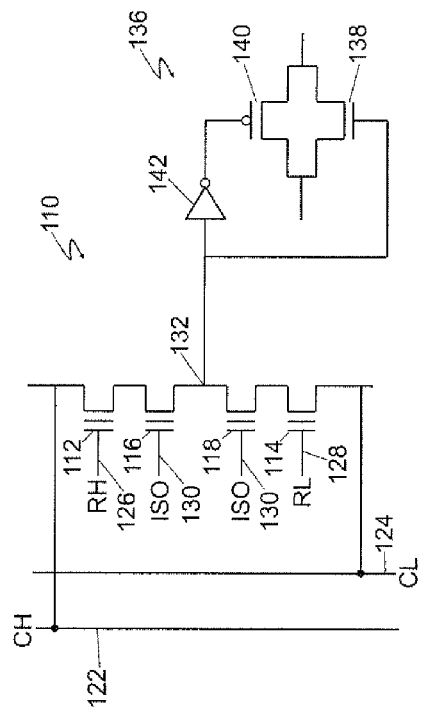

FIGS. 3A and 3B illustrate schematically a second embodiment of a non-volatile memory cell 110 according to the present invention. In non-volatile memory cell 110, first and second NMOS flash EEPROM transistors 112 and 114, respectively, are connected in a push-pull arrangement with first and second NMOS flash EEPROM isolation transistors 116 and 118 coupled in series. The first and second NMOS flash EEPROM transistors 112 and 114, respectively, and first and second NMOS flash EEPROM isolation transistors 116 and 118, respectively, are disposed in a triple well process described with respect to FIG. 2B.

The drain of first NMOS flash EEPROM transistor 112 is electrically coupled to a first column line (CH) 122, and the source of second NMOS flash EEPROM transistor 114 is electrically coupled to a second column line (CL) 124. The gates of first and second NMOS flash EEPROM transistors 112 and 114 are electrically coupled to first and second row lines (RH and RL) 126 and 128, respectively, and the gates of first and second NMOS flash EEPROM isolation transistors 116 and 118, respectively, are electrically coupled to isolation line (ISO) 130.

The source of first NMOS flash EEPROM transistor 112 is electrically coupled to the drain of first NMOS flash EEPROM isolation transistor 116, the drain of second NMOS flash EEPROM transistor 114 is electrically coupled to the source of second NMOS flash EEPROM isolation transistor 118, and the source and drain of first and second NMOS flash EEPROM isolation transistors 116 and 118, respectively, form a common node 132.

According to the present invention, the switch element in non-volatile memory cell 110 is depicted in FIG. 3A as n-channel MOS transistor 134 having a gate coupled to common node 132, and in FIG. 3B as a CMOS logic transistor switch 136 having gates coupled to common node 132. The CMOS logic transistor switch 136 includes an n-channel MOS transistor 138 and a p-channel MOS transistor 140 whose sources and drains are electrically coupled, respectively. The common node 132 is electrically coupled to the gate of n-channel MOS transistor 138 and to the gate p-channel MOS transistor 140 through an inverter 142. The output at common node 132 may otherwise be employed to drive a static device that programs the logic in the FPGA.

FIG. 3C illustrates a table which sets forth the voltages applied to the non-volatile memory cell 110 for the normal operation, erase, write, read and leakage read of the non-volatile memory cell 110 in FIGS. 3A and 3B. In each of these modes the p-type substrate or well depicted in FIG. 2B is at 0 volts.

In the operating mode, first column line CH is at 2.5 volts for the operation of the single NMOS switch 134 depicted in FIG. 3A, and at 1.5 volts for the operation of the CMOS switch 136 depicted in FIG. 3B, second column line CL is at 0 volts, first row line RH is at 1.5 volts, second row line RL is at 0 volts, isolation line ISO is at 1.5 volts, and the P-well 106 and the N-well 108 of the triple well process described with respect to FIG. 2B are at 0 volts and 0 volts, respectively.

In the erase mode, first column line CH is at 3 volts, second column line CL is at 3 volts, first row line RH is at −15 volts, second row line RL is at −15 volts, isolation line ISO is at 0 volts, and the P-well 106 and the N-well 108 of the triple well process described with respect to FIG. 2B are at 3 volts and 3 volts, respectively.

In the ISO write mode, first column line CH is at 0 volts, second column line CL is at 0 volts, first row line RH is at 0 volts, second row line RL is at 0 volts, isolation line ISO is at 15 volts, and the P-well 106 and the N-well 108 of the triple well process described with respect to FIG. 2B are at 0 volts and 0 volts, respectively.

In the write of second NMOS flash EEPROM transistor 114, first column line CH is at −3 volts, second column line CL is at −3 volts, first row line RH is at 0 volts, second row line RL is at 12 volts, isolation line ISO is at 0 volts, and the P-well 106 and the N-well 108 of the triple well process described with respect to FIG. 2B are at −3 volts and 3 volts, respectively.

In the write of first NMOS flash EEPROM transistor 112, first column line CH is at −3 volts, second column line CL is at −3 volts, first row line RH is at 12 volts, second row line RL is at 0 volts, isolation line ISO is at 0 volts, and the P-well 106 and the N-well 108 of the triple well process described with respect to FIG. 2B are at −3 volts and 3 volts, respectively.

In the read mode when first NMOS flash EEPROM transistor 112 is erased and second NMOS flash EEPROM transistor 114 is written, a read of the value at first NMOS flash EEPROM transistor 112 is performed when the first column line CH is lightly loaded to ground and then tested to pull up to approximately 2.5 volts for the configuration including the single NMOS switch 134 depicted in FIG. 3A, and to approximately 1.5 volts for the configuration including the CMOS switch 136 depicted in FIG. 3B when the first row line RH is ramped up to less than 1.5 volts, the second column line CL is at 3 volts for the configuration including the single NMOS switch 134 depicted in FIG. 3A, and to approximately 2 volts for the configuration including the CMOS switch 136 depicted in FIG. 3B, second row line RL is at 6 volts, isolation line ISO is at 6 volts, and the P-well 106 and the N-well 108 of the triple well process described with respect to FIG. 2B are at 0 volts and 0 volts, respectively.

In the read mode when first NMOS flash EEPROM transistor 112 is written and second NMOS flash EEPROM transistor 114 is erased, a read of the value at second NMOS flash EEPROM transistor 114 is performed when the first column line CH is lightly loaded to a positive voltage of at approximately 1 volt and then tested to pull down to approximately 0 volts when the second row line RL is ramped to less than 0 volts. For these conditions, second column line CL is at 0 volts, first row line RH is at 6 volts, isolation line ISO is at 6 volts, and the P-well 106 and the N-well 108 of the triple well process described with respect to FIG. 2B are at 0 volts and 0 volts, respectively.

In the read mode when first NMOS flash EEPROM transistor 112 is erased and second NMOS flash EEPROM transistor 114 is written, a read of the leakage at second NMOS flash EEPROM transistor 114 is performed when the first column line CH is forced to a predetermined acceptable leakage current, Imax leakage, and then tested to pull up to approximately 2.5 volts for the configuration including the single NMOS switch 134 depicted in FIG. 3A, and to approximately 1.5 volts for the configuration including the CMOS switch 136 depicted in FIG. 3B when the second row line RL is ramped up to greater than 0 volts. For these conditions, second column line CL is at 0 volts, first row line RH is at 1.5 volts, isolation line ISO is at 6 volts, and the P-well 106 and the N-well 108 of the triple well process described with respect to FIG. 2B are at 0 volts and 0 volts, respectively.

In the read mode when first NMOS flash EEPROM transistor 112 is erased and second NMOS flash EEPROM transistor 114 is written, a read of the leakage at first NMOS flash EEPROM transistor 112 is performed when the first column line CH is forced to a predetermined acceptable leakage current, Imax leakage, and then tested to pull up to approximately 2.5 volts for the configuration including the single NMOS switch 134 depicted in FIG. 3A, and to approximately 1.5 volts for the configuration including the CMOS switch 136 depicted in FIG. 3B when the first row line RH is ramped up to greater than 1.5 volts. For these conditions, second column line CL is at 0 volts, second row line RL is at 0 volts, isolation line ISO is at 6 volts, and the P-well 106 and the N-well 108 of the triple well process described with respect to FIG. 2B are at 0 volts and 0 volts, respectively.

It will be appreciated by those of ordinary skill in the art that during write and read operations unselected rows and columns will be inhibited to prevent write and read disturb of the values in the memory cells in the unselected rows and columns.

Figure 4A:
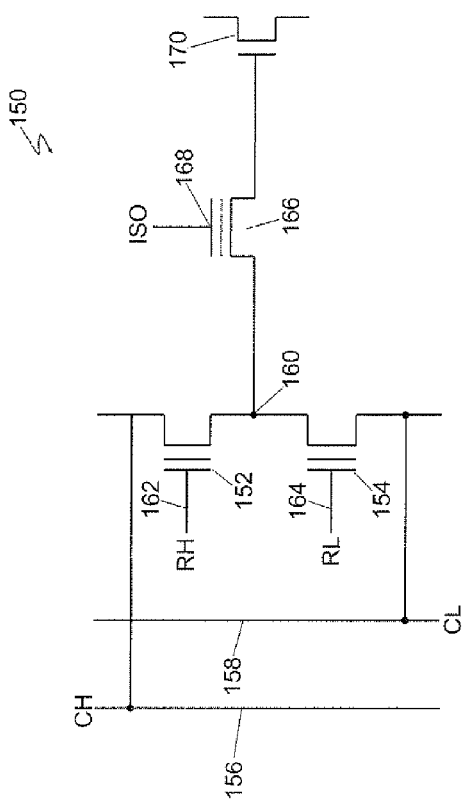
FIGS. 4A and 4B are schematic drawings illustrating a third embodiment of a non-volatile memory cell according to the present invention.
Figure 4B:
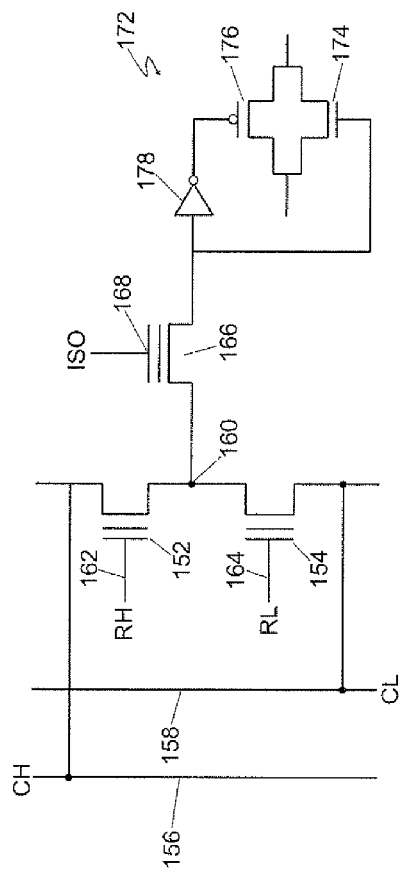

FIGS. 4A and 4B illustrate schematically a third embodiment of a non-volatile memory cell 150 according to the present invention. In non-volatile memory cell 150, first and second NMOS flash EEPROM transistors 152 and 154, respectively, are connected in a push-pull arrangement. The drain of first NMOS flash EEPROM transistor 152 is electrically coupled to a first column line (CH) 156, the source of second NMOS flash EEPROM transistor 154 is electrically coupled to a second column line (CL) 158, and the source and drain of first and second NMOS flash EEPROM transistors 152 and 154, respectively, form a common node 160. The gates of first and second NMOS flash EEPROM transistor 152 and 154, respectively, are electrically coupled to first and second row lines (RH and RL) 162 and 164, respectively.

The drain of an NMOS flash EEPROM isolation transistor 166 is coupled to the common node 160, and the gate NMOS flash EEPROM isolation transistor 166 is coupled to an isolation line (ISO) 168. First and second NMOS flash EEPROM transistors 152 and 154 and NMOS flash EEPROM isolation transistor 166 are all disposed in a triple well process described with respect to FIG. 2B.

According to the present invention, the switch element in non-volatile memory cell 150 is depicted in FIG. 4A as n-channel MOS transistor 170 having a gate coupled to the source of NMOS flash EEPROM isolation transistor 166, and in FIG. 4B as a CMOS logic transistor switch 172 having gates coupled to the source of NMOS flash EEPROM isolation transistor 166. The CMOS logic transistor switch 172 includes an n-channel MOS transistor 174 and a p-channel MOS transistor 176 whose sources and drains are electrically coupled, respectively. The source of NMOS flash EEPROM isolation transistor 166 is electrically coupled to the gate of n-channel MOS transistor 174 and to the gate p-channel MOS transistor 176 through an inverter 178. The output at the source of NMOS flash EEPROM isolation transistor 166 may otherwise be employed to drive a static device that programs the logic in the FPGA.

FIG. 4C illustrates a table which sets forth the voltages applied to the non-volatile memory cell 150 for the normal operation, erase, write, read and leakage read of the non-volatile memory cell 150 in FIGS. 4A and 4B. In each of these modes the p-type substrate or well depicted in FIG. 2B is at 0 volts.

In the operating mode, first column line CH is at 2.5 volts for the operation of the single NMOS switch 170 depicted in FIG. 4A, and at 1.5 volts for the operation of the CMOS switch 172 depicted in FIG. 4B, second column line CL is at 0 volts, first row line RH is at 1.5 volts, second row line RL is at 0 volts, isolation line ISO is at 1.5 volts, and the P-well 106 and the N-well 108 of the triple well process described with respect to FIG. 2B are at 0 volts and 0 volts, respectively.

In the erase mode, first column line CH is at 3 volts, second column line CL is at 3 volts, first row line RH is at −15 volts, second row line RL is at −15 volts, isolation line ISO is at 0 volts, and the P-well 106 and the N-well 108 of the triple well process described with respect to FIG. 2B are at 3 volts and 3 volts, respectively.

In the ISO write mode, first column line CH is at 0 volts, second column line CL is at 0 volts, first row line RH is at 0 volts, second row line RL is at 0 volts, isolation line ISO is at 15 volts, and the P-well 106 and the N-well 108 of the triple well process described with respect to FIG. 2B are at 0 volts and 0 volts, respectively.

In the write of second NMOS flash EEPROM transistor 154, first column line CH is at −3 volts, second column line CL is at −3 volts, first row line RH is at 0 volts, second row line RL is at 12 volts, isolation line ISO is at 0 volts, and the P-well 106 and the N-well 108 of the triple well process described with respect to FIG. 2B are at −3 volts and 3 volts, respectively.

In the write of first NMOS flash EEPROM transistor 152, first column line CH is at −3 volts, second column line CL is at −3 volts, first row line RH is at 12 volts, second row line RL is at 0 volts, isolation line ISO is at 0 volts, and the P-well 106 and the N-well 108 of the triple well process described with respect to FIG. 2B are at −3 volts and 3 volts, respectively.

In the read mode when first NMOS flash EEPROM transistor 152 is erased and second NMOS flash EEPROM transistor 154 is written, a read of the value at first NMOS flash EEPROM transistor 152 is performed when the first column line CH is lightly loaded to ground and then tested to pull up to approximately 2.5 volts for the configuration including the single NMOS switch 170 depicted in FIG. 4A, and to approximately 1.5 volts for the configuration including the CMOS switch 172 depicted in FIG. 4B when the first row line RH is ramped up to less than 1.5 volts. For these conditions, the second column line CL is at 3 volts for the configuration including the single NMOS switch 170 depicted in FIG. 4A, and to approximately 2 volts for the configuration including the CMOS switch 172 depicted in FIG. 4B, second row line RL is at 6 volts, isolation line ISO is at 6 volts, and the P-well 106 and the N-well 108 of the triple well process described with respect to FIG. 2B are at 0 volts and 0 volts, respectively.

In the read mode when first NMOS flash EEPROM transistor 152 is written and second NMOS flash EEPROM transistor 154 is erased, a read of the value at second NMOS flash EEPROM transistor 154 is performed when the first column line CH is lightly loaded to a positive voltage of approximately 1 volt and then tested to pull down to approximately 0 volts when the second row line RL is ramped to less than 0 volts. For these conditions, second column line CL is at 0 volts, first row line RH is at 6 volts, isolation line ISO is at 6 volts, and the P-well 106 and the N-well 108 of the triple well process described with respect to FIG. 2B are at 0 volts and 0 volts, respectively.

In the read mode when first NMOS flash EEPROM transistor 152 is erased and second NMOS flash EEPROM transistor 154 is written, a read of the leakage at second NMOS flash EEPROM transistor 154 is performed when the first column line CH is forced to a predetermined acceptable leakage current, Imax leakage, and then tested to pull up to approximately 2.5 volts for the configuration including the single NMOS switch 170 depicted in FIG. 4A, and to approximately 1.5 volts for the configuration including the CMOS switch 172 depicted in FIG. 4B when the second row line RL is ramped up to greater than 0 volts. For these conditions, second column line CL is at 0 volts, first row line RH is at 1.5 volts, isolation line ISO is at 6 volts, and the P-well 106 and the N-well 108 of the triple well process described with respect to FIG. 2B are at 0 volts and 0 volts, respectively.

In the read mode when first NMOS flash EEPROM transistor 152 is written and second NMOS flash EEPROM transistor 154 is erased, a read of the leakage at first NMOS flash EEPROM transistor 152 is performed when the first column line CH is forced to a predetermined acceptable leakage current, Imax leakage, and then tested to pull up to approximately 2.5 volts for the configuration including the single NMOS switch 170 depicted in FIG. 4A, and to approximately 1.5 volts for the configuration including the CMOS switch 172 depicted in FIG. 4B when the first row line RH is ramped up to greater than 1.5 volts. For these conditions, second column line CL is at 0 volts, second row line RL is at 0 volts, isolation line ISO is at 6 volts, and the P-well 106 and the N-well 108 of the triple well process described with respect to FIG. 2B are at 0 volts and 0 volts, respectively.

It will be appreciated by those of ordinary skill in the art that during write and read operations unselected rows and columns will be inhibited to prevent write and read disturb of the values in the memory cells in the unselected rows and columns.

Figure 5A:
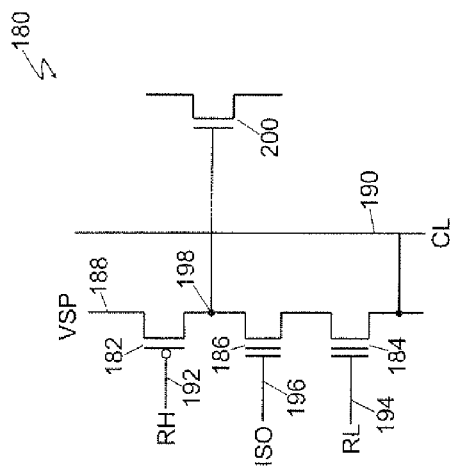
FIGS. 5A and 5B are schematic drawings illustrating a fourth embodiment of a non-volatile memory cell according to the present invention.
Figure 5B:
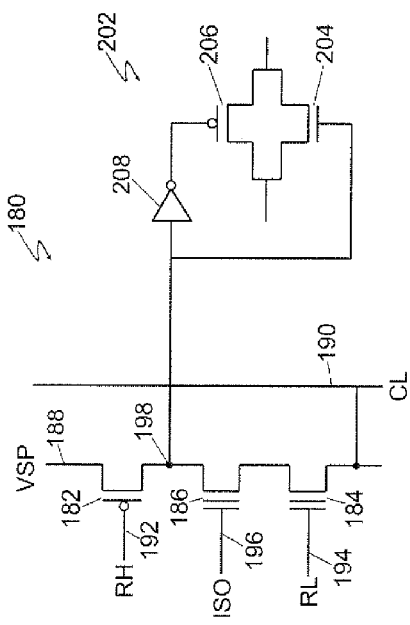

FIGS. 5A and 5B illustrate schematically a fourth embodiment of a non-volatile memory cell 180 according to the present invention. In non-volatile memory cell 180, p-channel MOS transistor 182 and NMOS flash EEPROM transistor 184 are connected in a push-pull arrangement with NMOS flash EEPROM isolation transistor 186 coupled in series. The p-channel MOS transistor 182 is disposed in the N-well, and the NMOS flash EEPROM transistors 184 and the NMOS flash EEPROM isolation transistor 186 are disposed the P-well, of the triple well process described with respect to FIG. 2B.

The source of p-channel MOS transistor 182 is electrically coupled to a voltage source (VSP) 188, and the source of NMOS flash EEPROM transistor 184 is electrically coupled to a column line (CL) 190. The gates of p-channel MOS transistor 182 and NMOS flash EEPROM transistors 184 are electrically coupled to first and second row lines (RH and RL) 192 and 194, respectively, and the gate of NMOS flash EEPROM isolation transistor 186 is electrically coupled to isolation line (ISO) 196.

The drain of p-channel MOS transistor 182 is electrically coupled to the drain of NMOS flash EEPROM isolation transistor 186 to form a common node 198, and the drain of NMOS flash EEPROM transistor 184 is electrically coupled to the source of NMOS flash EEPROM isolation transistor 186.

According to the present invention, the switch element in non-volatile memory cell 180 is depicted in FIG. 5A as n-channel MOS transistor 200 having a gate coupled to common node 188, and in FIG. 3B as a CMOS logic transistor switch 202 having gates coupled to common node 188. The CMOS logic transistor switch 202 includes an n-channel MOS transistor 204 and a p-channel MOS transistor 206 whose sources and drains are electrically coupled, respectively. The common node 188 is electrically coupled to the gate of n-channel MOS transistor 204 and to the gate p-channel MOS transistor 206 through an inverter 208. The output at output node 188 may otherwise be employed to drive a static device that programs the logic in the FPGA.

FIG. 5C illustrates a table which sets forth the voltages applied to the non-volatile memory cell 180 for the normal operation, erase, write, read and leakage read of the non-volatile memory cell 180 in FIGS. 5A and 5B. In each of these modes the p-type substrate or well depicted in FIG. 2B is at 0 volts.

In the operating mode, voltage source VSP is at 2.5 volts for the operation of the n-channel MOS transistor switch 200 depicted in FIG. 5A, and at 1.5 volts for the operation of the CMOS switch 202 depicted in FIG. 5B, column line CL is at 0 volts, first row line RH is at approximately 2.2 volts, second row line RL is at 0.8 volts, isolation line ISO is at 1.5 volts, and the P-well 106 and the N-well 108 of the triple well process described with respect to FIG. 2B are at 0 volts and 2.5 volts, respectively.

In the ISO write mode, voltage source VSP is at 0 volts, column line CL is at 0 volts, first row line RH is at 0 volts, second row line RL is at 0 volts, isolation line ISO is at 15 volts, and the P-well 106 and the N-well 108 of the triple well process described with respect to FIG. 2B are at 0 volts and 0 volts, respectively.

In the erase mode, voltage source VSP is at 3 volts, column line CL is at 3 volts, first row line RH is at 0 volts, second row line RL is at −15 volts, isolation line ISO is at 0 volts, and the P-well 106 and the N-well 108 of the triple well process described with respect to FIG. 2B are at 3 volts and 3 volts, respectively.

In the write of NMOS flash EEPROM transistor 184, voltage source VSP is at 3 volts, column line CL is at −3 volts, first row line RH is at 0 volts, second row line RL is at 12 volts, isolation line ISO is at −3 volts, and the P-well 106 and the N-well 108 of the triple well process described with respect to FIG. 2B are at −3 volts and 3 volts, respectively.

In the read mode when NMOS flash EEPROM transistor 184 is erased, a read of the value at NMOS flash EEPROM transistor 184 is performed when column line CL is lightly loaded to a negative voltage of at least −1 volts and then tested to pull up to approximately 0 volts when the second row line RL is ramped up to less than 0 volts, the voltage source VSP is at 2.5 volts, second row line RH is at 1.5 volts, isolation line ISO is at 6 volts, and the P-well 106 and the N-well 108 of the triple well process described with respect to FIG. 2B are at −1 volt and 2.5 volts, respectively.

In the read mode when NMOS flash EEPROM transistor 184 is written, a read of the leakage at NMOS flash EEPROM transistor 184 is performed when the voltage source VSP is forced to a predetermined acceptable leakage current, Imax leakage, and then tested to pull up to approximately 2.5 volts for the configuration including the n-channel MOS transistor switch 200 depicted in FIG. 5A, and to approximately 1.5 volts for the configuration including the CMOS switch 202 depicted in FIG. 5B when the second row line RL is ramped up to greater than 0 volts. For these conditions, column line CL is at 0 volts, first row line RH is at 1.5 volts, isolation line ISO is at 6 volts, and the P-well 106 and the N-well 108 of the triple well process described with respect to FIG. 2B are at 0 volts and 0 volts, respectively.

Figure 6:
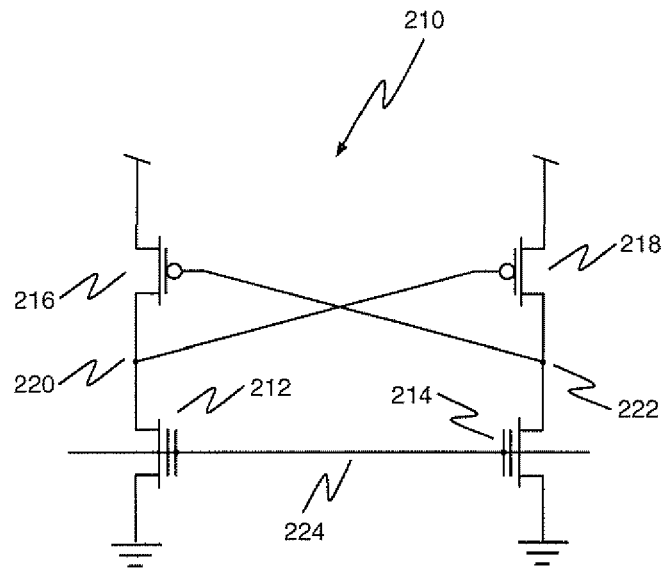
FIG. 6 is a schematic drawing illustrating a fifth embodiment of a non-volatile memory cell according to the present invention.

FIG. 6 shows a cross-coupled one-bit memory non-volatile configuration memory cell 210 which produces both true (X) and complemented (X') outputs. In non-volatile memory cell 210, first and second NMOS floating gate transistors 212 and 214 are connected as pull-down devices to drive cross-coupled p-channel MOS transistors 216 and 218. The sources of first and second NMOS floating gate transistors 212 and 214 are electrically coupled to first and second column lines (X' and X) 220 and 222, respectively. The drains of NMOS floating gate transistors 212 and 214 are electrically coupled to the gates of p-channel MOS transistors 218 and 216, respectively. The gates of first and second floating gate transistors 212 and 214 are electrically coupled to a row line (R) 224.

The embodiment of FIG. 6 is similar to the embodiment shown in FIG. 2A, but excludes the switches 102, 104. One or the other but not both of the floating gate devices are programmed. The floating gate devices shown could be silicon nanocrystal or other non-volatile devices. This kind of cross-coupled cell is very reliable and consumes little static power. It may be especially useful in radiation tolerant FPGAs where reliability is more of a concern than die area. The non-volatile devices need have only a small "window" between their programmed and erased threshold voltages.

Figures 7A, 7B:
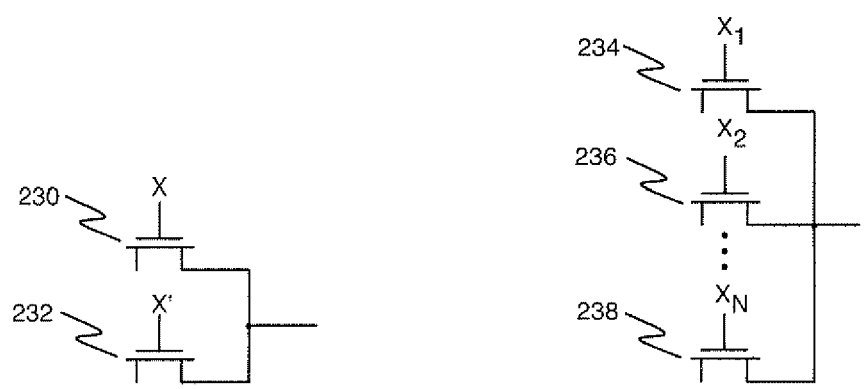
FIGS. 7A and 7B are schematic drawings illustrating how one or both outputs of the cross-coupled cell of 6 can be used to control a single-level NMOS multiplexer that may be used, for example, to control routing signals in an FPGA.

FIGS. 7A and 7B show how one or both outputs of the cross-coupled cell can be used to control a single-level NMOS multiplexer. The multiplexer would typically be used for routing signals in an FPGA. FIG. 7A shows a 2-input multiplexer including transistors 230 and 232. In this case both the true and complemented outputs X and X' of a single cell are used to drive the gates of transistors 230 and 232, respectively, and only one cell is sufficient to control both inputs to the multiplexer. FIG. 7B shows an N-input multiplexer where N>2. In this case, one cell must be used to control each input. Thus, the three-input multiplexer shown includes transistors 234, 236, and 238. For large N, persons of ordinary skill in the art will appreciate that the multiplexer may be efficiently built in two or more levels, e.g. an 8-input multiplexer can be made of two 4:1 multiplexers in the first stage and a 2:1 multiplexer in the second stage. The 2:1 multiplexer can be controlled by one cell. Four cells suffice to control both 4:1 multiplexers.

Persons of ordinary skill in the art will appreciate that if CMOS multiplexers are used, each multiplexer input has a corresponding pair of NMOS and PMOS pass transistors in parallel. In this case, a single configuration cell can control the gates of both transistors for a single input, for example with X on the NMOS gate and X' on the PMOS gate.

Figure 8A:
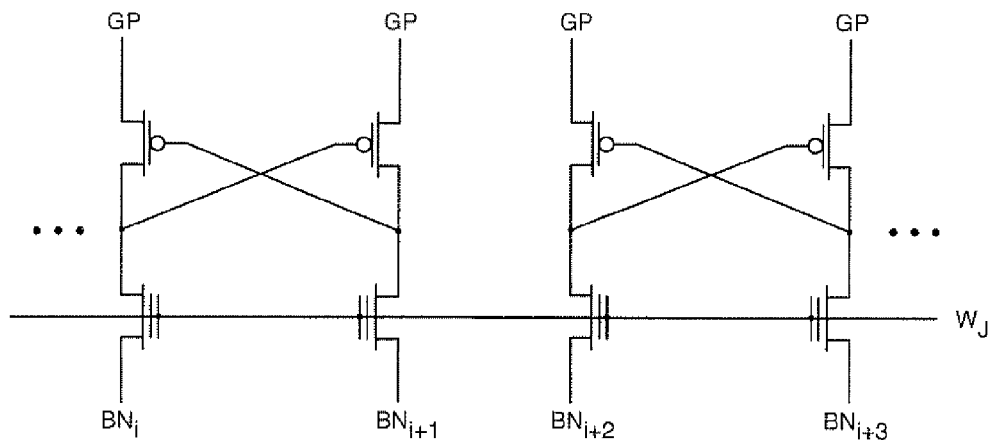
FIGS. 8A through 8D are schematic drawings showing alternative schemes for addressing the cross-coupled cell of FIG. 6.
Figure 8B:
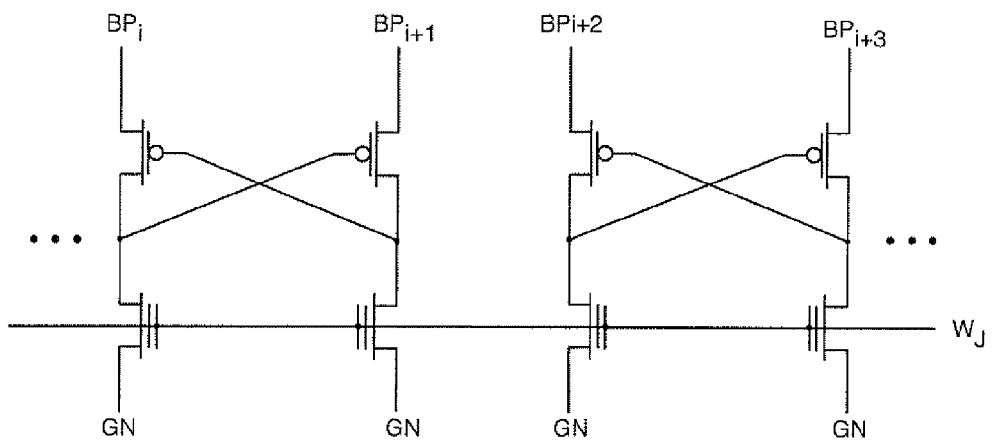
Figure 8C:
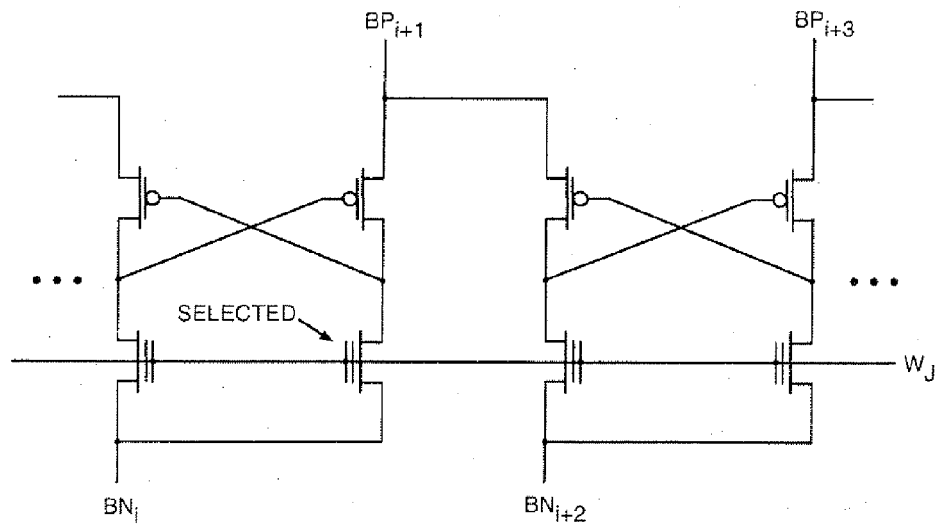
Figure 8D:
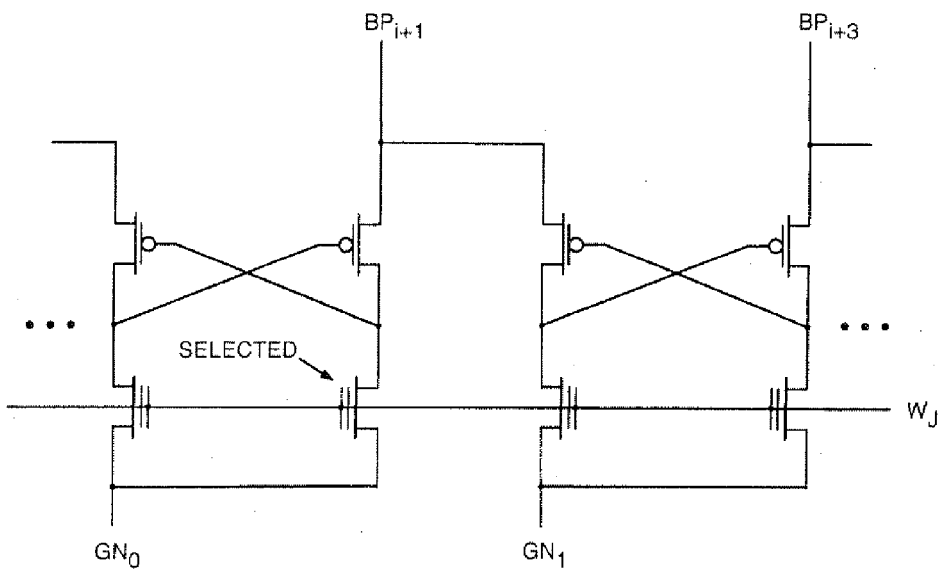

Next, several alternative schemes for addressing the cross-coupled configuration cell of FIG. 6 are described. Four schemes are shown in FIGS. 8A through 8D. Table 1 below shows the voltages required at various points indicated on FIGS. 8A through 8D to erase all cells (using the Fowler-Nordheim or "FN" technique) and to program the selected cell transistor (using hot carrier injection). The selected cell transistor is indicated in FIGS. 8C and 8D. In all schemes there is a unique word line $W_j$ for each row of cells.

TABLE 1

| Scheme A | selected W | other W | Nwell | Pwell | selected BN | other BN | GP |
|---|---|---|---|---|---|---|---|
| Erase | −8 | −8 | 8 | 8 | 8 or float | 8 or float | 8 |
| Program | 8 | 0 | 1 | −2 | 4.5 | −2 | 0 |
| Scheme B | selected W | other W | Nwell | Pwell | GN | selected BP | other BP |
| Erase | −8 | −8 | 8 | 8 | 8 or float | 8 or float | 8 |
| Program | 8 | 0 | 4.5 | 0 | 0 | 4.5 | 0 |
| Scheme C | selected W | other W | Nwell | Pwell | $BN_{i+2}$ | other BN | $BP_{i+1}$ | other BP |
| Erase | −8 | −8 | 8 | 8 | 8 or float | 8 or float | 8 | 8 |
| Program | 8 | 0 | 4.5 | 0 | 4.5 | 0 | 4.5 | 0 |
| Scheme D | selected W | other W | Nwell | Pwell | GN0 | GN1 | $BP_{i+1}$ | other BP |
| Erase | −8 | −8 | 8 | 8 | 8 or float | 8 or float | 8 | 8 |
| Program | 8 | 0 | 4.5 | 0 | 0 | 4.5 | 4.5 | 0 |

Table 2 below shows the voltages required at various points indicated on FIGS. 8A through 8D to erase all cells and to program the selected cell transistor when a nanocrystal cell structure is used.

TABLE 2

| Scheme A | selected W | other W | Nwell | Pwell | selected BN | other BN | GP |
|---|---|---|---|---|---|---|---|
| Erase | −7 | −7 | 7 | 7 | 7 or float | 7 or float | 7 |
| Program | 7 | 0 | 1 | −2 | 3.5 | −2 | 0 |

| Scheme B | selected W | other W | Nwell | Pwell | GN | selected BP | other BP |
|---|---|---|---|---|---|---|---|
| Erase | −7 | −7 | 7 | 7 | 7 or float | 7 or float | 7 |
| Program | 7 | 0 | 3.5 | 0 | 0 | 3.5 | 0 |

| Scheme C | selected W | other W | Nwell | Pwell | $BN_{i+2}$ | other BN | $BP_{i+1}$ | other BP |
|---|---|---|---|---|---|---|---|---|
| Erase | −7 | −7 | 7 | 7 | 7 or float | 7 or float | 7 | 7 |
| Program | 7 | 0 | 3.5 | 0 | 3.5 | 0 | 3.5 | 0 |

| Scheme D | selected W | other W | Nwell | Pwell | GN0 | GN1 | $BP_{i+1}$ | other BP |
|---|---|---|---|---|---|---|---|---|
| Erase | −7 | −7 | 7 | 7 | 7 or float | 7 or float | 7 | 7 |
| Program | 7 | 0 | 3.5 | 0 | 0 | 3.5 | 3.5 | 0 |

In scheme A (FIG. 8A), a global signal GP is connected to the sources of all pull-up devices. A unique bit line $BP_i$ connects to the sources of all pull-down devices in a column i of transistors. Thus there are two bit lines per column of cross-coupled cells.

In scheme B (FIG. 8B), a global signal GN is connected to the sources of all pull-down devices. A unique bit line $BN_i$ connects to the sources of all pull-up devices in column i of transistors. Thus there are two bit lines per column of cross-coupled cells.

In scheme C (FIG. 8C), there is a unique bit line $BP_{i+1}$ shared by the sources of all pull-up devices in adjacent columns i+1 and i+2. There is an unique bit line $BN_i$ shared by the sources of all pull-down devices in adjacent columns i and i+1 of cells. Thus there are two bit lines per column of cross-coupled cells. No global line is required. Persons of ordinary skill in the art will appreciate that the layout may share diffusions of devices sharing a bit line, thus saving area.

In scheme D (FIG. 8D), there is a unique bit line $BP_{i+1}$ shared by the sources of all pull-ups in adjacent columns i+1 and i+2. A global line GN0 is shared by the sources of all pull-downs in column i and i+1 where i is a multiple of 4. A global line $GN_i$ is shared by the sources of all pull-downs in columns i+2 and i+3 where i is a multiple of 4. Thus there is one bit line and two global lines per column of cross-coupled cells. This embodiment also allows for the possibility of saving layout area by sharing diffusions of devices that have a common source.

There are other possible erase and program methods applicable to these bit cells. For instance, the cells may be programmed using FN tunneling and may be erased using band-to-band erase (hot-hole erase). Another possibility is to use a combination of FN and band-to-band erase.

It will be appreciated by those of ordinary skill in the art that during write and read operations unselected rows and columns will be inhibited to prevent write and read disturb of the values in the memory cells in the unselected rows and columns.

Those of ordinary skill in the art will appreciate that in the above description, the source and drain regions of the transistors have been specifically called out to aid in understanding the present invention, and that the source and drain regions may be identified as source/drain regions.

Those of ordinary skill in the art will further appreciate that columns and rows have also been described as such as an aid to understanding the present invention, and that the column and row designations indicate conductive lines that provide the appropriate signal transmission for the devices to which they are electrically coupled.

Figure 9A:
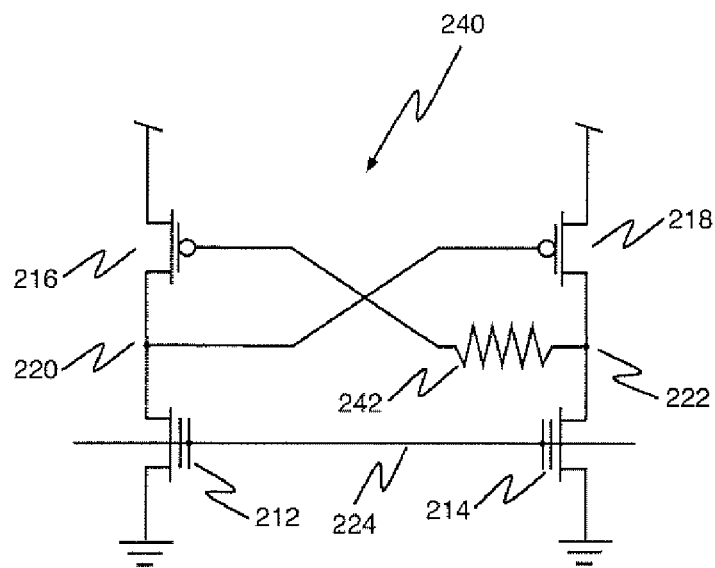
FIGS. 9A and 9B, schematic diagrams show two radiation-tolerant cross-coupled one-bit memory non-volatile configuration memory cells according to the present invention.
Figure 9B:
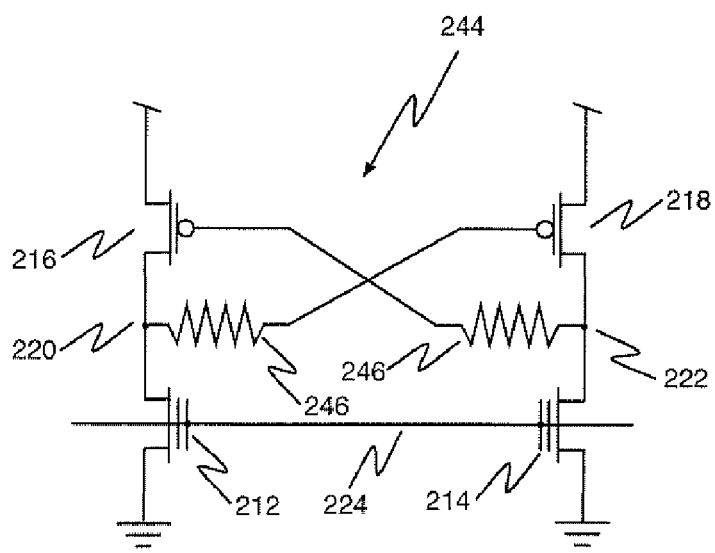

Referring now to FIGS. 9A and 9B, schematic diagrams show two radiation-tolerant cross-coupled one-bit memory non-volatile configuration memory cells according to the present invention. In FIG. 9A, cross-coupled one-bit memory non-volatile configuration memory cell 240 is shown as being similar to the cross-coupled one-bit memory non-volatile configuration memory cell 210 of FIG. 6 except for the addition of resistor 242 in series between the common drain connection of transistors 218 and 222 and the gate of transistor 216. Resistor 242 may be formed from undoped polysilicon as is known in the semiconductor art. The addition of resistor 242 in combination with the capacitance of transistor 216 creates an RC time constant in the range of between about 100 ns and about 1 μs that is longer than the recovery time of the cross-coupled cell structure. Given the typical capacitance of a small transistor such as transistor 216, resistor 242 may have a value of, for example, between about several M-ohms and about a G-ohm.

In FIG. 9B, cross-coupled one-bit memory non-volatile configuration memory cell 244 is shown as being similar to the cross-coupled one-bit memory non-volatile configuration memory cell 240 of FIG. 9A except for the addition of resistor 246 in series between the common drain connection of transistors 212 and 216 and the gate of transistor 218. Resistor 246 may also be formed from undoped polysilicon as is known in the semiconductor art. The addition of resistor 246 in combination with the capacitance of transistor 218 creates a second RC time constant in the range of between about 100 ns and about 1 μs that is longer than the recovery time of the cross-coupled cell structure. Given the typical capacitance of a small transistor such as transistor 218, resistor 246 may also have a value of, for example, between about several M-ohms and about a G-ohm.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A non-volatile memory cell comprising:
   a first floating gate transistor having a drain coupled to a column-high line, a control gate electrically coupled to a row-high line, and a source;
   a second floating gate transistor having a source coupled to a column-low line, a control gate electrically coupled to a row-low line, and a drain;
   a third floating gate transistor having a drain coupled to the source of the first floating gate transistor, a control gate electrically coupled to an isolation control line, and a source coupled to an output node; and
   a fourth floating gate transistor having a source coupled to the drain of the second floating gate transistor, a control gate electrically coupled to the isolation control line, and a drain coupled to the output node.

2. The non-volatile memory cell of claim 1, wherein the non-volatile memory cell comprises a programmable element for a programmable logic device.

3. The non-volatile memory cell of claim 2, wherein the programmable logic device comprises a field programmable gate array.

4. The non-volatile memory cell of claim 1, wherein the first, second, third, and fourth floating gate transistors are NMOS floating gate transistors.

5. The non-volatile memory cell of claim 1, wherein the first and second floating gate transistors are NMOS silicon nanocrystal transistors.

6. The non-volatile memory cell of claim 1, wherein the output node is coupled to a pass transistor.

7. The non-volatile memory cell of claim 1, wherein the output node is coupled to a pass gate.

* * * * *